(12) United States Patent
Guo et al.

(10) Patent No.: US 8,618,814 B2
(45) Date of Patent: Dec. 31, 2013

(54) HIGH BANDWIDTH PASSIVE SWITCHING CURRENT SENSOR

(75) Inventors: Fei Guo, Ontario (CA); Wei He, Ontario (CA); Yuhong Zhang, Ontario (CA); Mark Frankovich, Ontario (CA)

(73) Assignee: ATI Technologies ULC, Markham, Ontario (CA)

( * ) Notice: Subject to any disclaimer, the term of this patent is extended or adjusted under 35 U.S.C. 154(b) by 464 days.

(21) Appl. No.: 13/022,201

(22) Filed: Feb. 7, 2011

(65) Prior Publication Data

US 2012/0200303 A1 Aug. 9, 2012

(51) Int. Cl.
*G01R 29/26* (2006.01)
(52) U.S. Cl.
USPC .......................................... 324/613; 324/654
(58) Field of Classification Search
None
See application file for complete search history.

(56) References Cited

U.S. PATENT DOCUMENTS

| | | | |
|---|---|---|---|
| 6,195,274 B1 | 2/2001 | Schroderus et al. | |
| 2009/0167261 A1* | 7/2009 | Trochut | ........................ 323/234 |
| 2009/0279224 A1 | 11/2009 | Ayyanar et al. | |

OTHER PUBLICATIONS

J.A. Weaver et al., Measurement of Supply Pin Current Distributions in Integrated Circuit Packages, IEEE 2007.
Analog Devices, Active Energy Metering IC with di/dt Sensor Interface, ADE7759, 2002.
Agilent Technologies, Select & Compare: Oscilloscope current probes webpage, printed Oct. 19, 2010.
TEKTRONIX, Current Probes webpage, printed Oct. 19, 2010.
D&R Industry Articles, On-chip di/dt Detector IP for Power Supply webpage, printed Aug. 27, 2010.

* cited by examiner

*Primary Examiner* — Thomas Valone
(74) *Attorney, Agent, or Firm* — Volpe and Koenig, P.C.

(57) ABSTRACT

In an printed circuit board on which an integrated circuit die is mounted, an array of plated through holes (PTHs) are formed which include conductive power and ground PTH structures which are connected to provide power and ground reference voltages to the integrated circuit die, and isolated current sensing PTH structures which are formed within sensing proximity to the conductive power and ground PTH structures for sensing current switching activity in the conductive power and ground PTH structures by inductively converting dynamic current changes in the conductive power and ground PTH structures into a measurable voltage signal.

21 Claims, 4 Drawing Sheets

HIGH BANDWIDTH PASSIVE SWITCHING CURRENT SENSOR

BACKGROUND OF THE INVENTION

1. Field of the Invention

The present invention relates in general to integrated circuits. In one aspect, the present invention relates to a current sensor and method for operating same to measure switching current activity.

2. Description of the Related Art

With today's high performance chip and system designs, there can be significant design challenges caused by digital core power supply noise that is caused by switching currents in the core circuit, depending on how the power is supplied to the chip, package, and board power distribution layers. For example, the inability to accurately determine the die level current draw and/or switching activity of processors and other application specific integrated circuit (ASIC) core circuits is a significant gap in the analysis and design of power delivery networks, resulting in over design or under design of the power delivery networks. Although low frequency methods of direct measurement are available, the large number of power and ground connections on a package makes high frequency measurements extremely difficult. Conventional current sensing solutions use current probes at the output of the regulator to measure current activity, but such probes have limited bandwidth and cannot quantify the switching current activity (referred to as di/dt) with current technologies where switching activity is quite fast. As a result, commercially available probes have limited resolution in profiling power switching activity.

Accordingly, a need exists for an improved circuit, method and system for sensing fast current switching events which addresses various problems in the art that have been discovered by the above-named inventors where various limitations and disadvantages of conventional solutions and technologies will become apparent to one of skill in the art after reviewing the remainder of the present application with reference to the drawings and detailed description which follow, though it should be understood that this description of the related art section is not intended to serve as an admission that the described subject matter is prior art.

SUMMARY OF EMBODIMENTS OF THE INVENTION

Broadly speaking, embodiments of the present invention provide a system, method and dynamic current sensor apparatus for sensing fast current switching events by forming one or more passive current sensing structures within sensing proximity to one or more power and/or ground conductors. In selected embodiments, the power and/or ground conductors may be formed in the printed circuit board substrate as an array of plated through holes (PTH) that surround the power and/or ground conductors that are also formed in the printed circuit board substrate or electronic packaging. Thus positioned within sensing proximity to the power and/or ground conductors, the passive current sensing structures are able to sense current switching activity in the power and/or ground conductors by converting dynamic changes in the power supply current into a measurable voltage signal. In addition to accurately sensing switching current activity with available package or PCB manufacturing technology, the disclosed passive current sensing structures can also be used sense a voltage supply level change for use as an input to a power control regulator, or to feedback supply noise as part of a feedback system. By forming and allocating passive current sensing structures as an array of serially-connected PTH conductors that surround the power and/or ground conductors, a current sensor is provided that is highly sensitive to high frequency switching current activity without being sensitive to low frequency switching currents, thereby enabling accurate power and load analysis.

In selected example embodiments, an electronic apparatus and method of operation are provided for sensing switching current noise (di/dt) in a power delivery network for an integrated circuit die. The disclosed apparatus includes an integrated circuit die (e.g., a GPU ASIC) having a plurality of conductive power and/or ground connection leads forming a power delivery network for receiving a Vdd operating voltage and a Vss operating voltage which are connected to provide power and ground reference voltages to the integrated circuit die. The apparatus also includes a circuit substrate (e.g., a printed circuit board) on which the integrated circuit die is disposed or attached. One or more conductive power and/or ground connection structures are formed in the circuit substrate to be electrically connected, respectively, to the plurality of conductive power and/or ground connection leads. In the circuit substrate, the conductive power structures receive a Vdd operating voltage and/or the conductive ground connection structures receive a Vss operating voltage so as to provide power and/or ground reference voltages to the integrated circuit die. In addition, one or more isolated current sensing structures are formed in the circuit substrate within sensing proximity to the conductive power and/or ground connection structure(s) for sensing current switching activity in the conductive power and/or ground connection structure(s) by inductively converting dynamic current changes in the conductive power and/or ground connection structure(s) into a measurable voltage signal. As formed, the isolated current sensing structures are positioned in the circuit substrate to induce a voltage change from any switching current (di/dt) in at least one of the plurality of conductive power and/or ground connection structures. In selected embodiments, the circuit substrate is formed as a printed circuit board having a plurality of conductive PTH structures, including conductive PTH structures for electrically connecting external power and ground supply reference voltages to conductive power and ground connection leads on the integrated circuit die, at least a first isolated conductive PTH structure formed within sensing proximity to the conductive PTH structures for sensing current switching activity in the power supply reference voltage, and a second isolated conductive PTH structure formed within sensing proximity to the conductive PTH structures for sensing current switching activity in the ground supply reference voltage. When formed as an isolated PTH power probe in the circuit substrate, the isolated current sensing structure is positioned within sensing proximity to the power connection structures and the ground connection structures so as to produce greater mutual coupling to the power connection structures than the ground connection structures. Conversely, when formed as an isolated PTH ground probe in the circuit substrate, the isolated current sensing structure is positioned within sensing proximity to the power connection structures and the ground connection structures so as to produce greater mutual coupling to the ground connection structures than the power connection structures. In selected embodiments, the isolated current sensing structures may be formed in the circuit substrate as a plurality of isolated PTH current probes that are connected in series to combine each voltage signal induced at each isolated PTH probe into a single combined voltage signal representation of the switching current noise (di/dt) in the power delivery network for the integrated circuit die.

In other embodiments, a method and apparatus are provided for sensing switching current noise (di/dt) in a power delivery network for an integrated circuit die. In operation, a circuit substrate (e.g., printed circuit board) is provided that is affixed to an integrated circuit die (e.g., a GPU) such that conductive power and/or ground connection leads from the integrated circuit die are electrically connected, respectively, to conductive power and/or ground connection structures formed in the circuit substrate. The provided circuit substrate also includes one or more passive current sensing structures formed within sensing proximity to the plurality of conductive power and/or ground connection structures. In selected embodiments, the circuit substrate is provided as a printed circuit board which includes a first plurality of conductive PTH structures to electrically connect one or more external power supply reference voltages to conductive power connection leads on the integrated circuit die, and which also includes a second plurality of conductive PTH structures to electrically connect one or more external ground supply reference voltages to conductive ground connection leads on the integrated circuit die. In addition, the printed circuit board includes one or more isolated conductive PTH structures formed as passive current sensing structures within sensing proximity to the first (or second) plurality of conductive PTH structures for sensing current switching activity in the first (or second) plurality of conductive PTH structures. When reference voltages and input stimuli supplied to activate the integrated circuit die, the one or more passive current sensing structures are used to sense current switching activity in the conductive power and/or ground connection structures by inductively converting dynamic current changes in the conductive power and/or ground connection structures into one or more measurable voltage signals. The current switching activity may be sensed by inducing on the one or more passive current sensing structures a voltage change from any switching current (di/dt) in at least one of the plurality of conductive power and/or ground connection structures when the integrated circuit die is activated by the reference voltages and input stimuli. In addition or in the alternative, the current switching activity may be sensed by calculating a voltage change $V=\Sigma M_j di_j/dt$ across a first passive current sensing structure, where $M_j$ is a measure of mutual inductance between the first passive current sensing structure and a jth conductive power and/or ground connection structure, and $di_j/dt$ is the current change at the jth conductive power and/or ground connection structure. In addition, the measurable voltage signals generated by the passive current sensing structure(s) may be provided as an input to a switching current (di/dt) detector formed on the integrated circuit die.

In yet other embodiments, a high bandwidth sensor is provided for sensing switching current noise (di/dt) in a power delivery network for an integrated circuit die. The disclosed sensor includes a plurality of current probe sensing PTH structures arrayed in relation to a plurality of conductive PTH structures in the power delivery network to sense current switching activity in the plurality of conductive PTH structures by inductively converting dynamic current changes in the plurality of conductive PTH structures into one or more measurable voltage signals. In selected embodiments, the plurality of current probe sensing PTH structures are formed in an array of the plurality of conductive PTH structures in the power delivery network and connected in series to combine each voltage signal induced at each of the plurality of current probe sensing PTH structures into a single combined voltage signal representation of the switching current noise (di/dt) in the power delivery network for the integrated circuit die.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
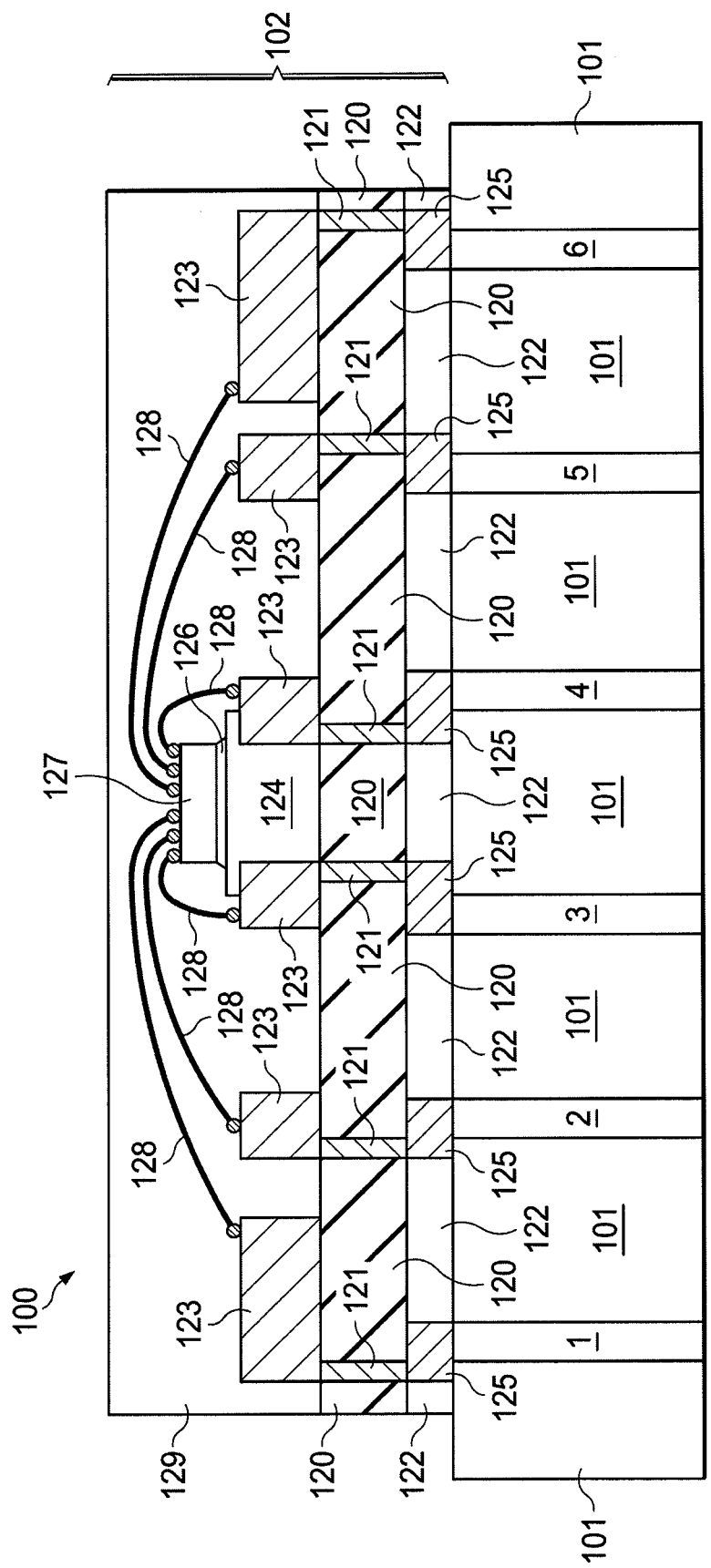
FIG. 1 illustrates a cross-sectional view of a packaged assembly mounted to an printed circuit board (PCB)

A high bandwidth passive switching current sensor architecture and fabrication methodology are described for dynamically sensing fast current switching events using conductive plated through hole (PTH) structures in a printed circuit board or through-silicon-via (TSV) structures in a silicon substrate to measure and quantify fast switching current (a.k.a., di/dt) events. In selected embodiments, an array of one or more conductive plated through hole (PTH) structures are formed in a printed circuit board (PCB) to serve as sensors for power and/or ground conductors which are also formed in the PCB which provide current (and voltage) to the integrated circuit chip mounted on the printed circuit board. As formed in the PCB, each PTH structure is electrically isolated from the power and/or ground conductor(s) in the PCB, but is positioned for inductive coupling to the power and/or ground conductor so that current changes in the power and/or ground conductors is converted into a measurable parameter (e.g., voltage). The positioning of one or more PTH structure within sensing proximity to one or more power conductors for a portion of an integrated circuit allows detection and measurement of dynamic changes in the power supply current provided by the power conductors to that portion of the integrated circuit. Likewise, the positioning of one or more PTH structure within sensing proximity to one or more ground conductors for a specified IC portion allows detection and measurement of dynamic changes in the ground supply current provided by the ground conductors to the specified IC portion. By properly controlling the spacing and allocation of the PTH structures within an alternating pattern of power and ground conductors in the PCB substrate, a first PTH structure may be positioned in the pattern in close proximity to one or more power conductors to detect current changes in the power conductors, thereby serving as a power path probe. In addition or in the alternative, the spacing and allocation of the PTH structures may be controlled so that a second PTH structure is positioned in close proximity to one or more ground conductors to detect current changes in the ground conductors, thereby serving as a ground path probe. The flexible allocation of PTH structures in the PCB allows current probes to be located as needed so that different current switching activity in different regions of the PCB (and the corresponding regions of the integrated circuit) can be separately monitored and measured. In addition to being implemented as conductive PTH structures in a PCB, the passive switching current structures may be implemented at any level of the final electronic device, including being implemented as conductive TSV structures within a semiconductor substrate, or as conductive sensor structures in any packaging level.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are shown in block diagram form, rather than in detail, in order to avoid limiting or obscuring the present invention. In addition, selected aspects are depicted with reference to simplified cross sectional drawings of a electronic device without including every device feature or geometry in order to avoid limiting or obscuring the present invention. Such descriptions and representations are used by those skilled in the art to describe and convey the substance of their work to others skilled in the art. In addition, although specific example materials are described herein, those skilled in the art will recognize that other materials with similar properties can be substituted without loss of function.

Referring now to FIG. 1, there is shown a cross-sectional view 100 of a packaged assembly 102 mounted to a printed circuit board (PCB) 101. While FIG. 1 depicts a wire bond type of package, it will be appreciated that selected embodiments of the present invention may be implemented with other types of packaging, including but not limited to flip-chip type packages, 3-D stacked packages, etc. The packaging assembly 102 includes a carrier substrate 120 in which are formed one or more via conductors 121 that extend between opposite (e.g., upper and lower) surfaces of the carrier substrate 120. As will be appreciated, the carrier substrate 120 may be formed to any desired shape and thickness, and may include any desired features for use in forming a functional semiconductor package. In addition, the carrier substrate 120 may be fabricated with a relatively thin, flexible film of an electrically insulative material (such as an organic polymer resin), or with a rigid, substantially planar member fabricated from any material that is suitable for use as a carrier substrate.

The depicted packaging assembly 102 includes a conductive pattern of conductive traces, vias and contact pad areas formed on and through the carrier substrate 120 for purposes of electrically connecting the contact structures 125 to the integrated circuit die 127. For example, one or more first contact pads or layers 123 are formed on a first (upper) surface of the carrier substrate 120 and are electrically connected by conductive trace layer(s) to one or more conductive vias 121 formed in the carrier substrate 120. In addition, one or more second contact structures 125 are formed and positioned peripherally to be electrically connected by conductive trace layer(s) to one or more conductive vias 121 formed in the carrier substrate 120. As will be appreciated, one or more internal conductive layers (not shown) may be formed in the carrier substrate 120 for making electrical contact between a contact structure 125 and a corresponding contact pad/layer 123, though for purposes of simplifying the description, they are represented by the conductive vias 121. Finally, individual circuit lines formed on a surface of the carrier substrate (e.g., from second contact structures 125) are electrically separated from one another with selectively formed dielectric layers (e.g., insulator layers 122). As will be appreciated, the conductive traces and contact areas may be formed from any conductive material, including but not limited to conductively doped polysilicon, a conductive metal or metal alloy, conductive or conductor-filled elastomer, or any other conductive material used for electrical connections known to those skilled in the art.

As further illustrated in the packaging assembly 102, an integrated circuit die 127 is attached to a die pad 124 on the carrier substrate 120, either directly or using an adhesive layer 126 (such as die attach epoxy). Once affixed to the substrate 120, the integrated circuit die 127 is electrically connected to the active surface of the integrated circuit die 127 which includes one or more bond pads (not shown) that provide electrical connection to the circuitry in the integrated circuit die 127. In particular, each bond pad of the integrated circuit die 127 may be electrically connected to its corresponding first contact pads or layer 123 on the carrier substrate 120 using an intermediate conductive element 128 (such as a bond wire, a thermosonic ball bond, a conductive TAB element carried upon a flexible dielectric film, a bonded lead, or the like). Once the intermediate conductive elements 128 are formed to electrically connect the integrated circuit die 127 to the carrier substrate 120, an encapsulation layer or material 129 may be formed to seal and protect the conductive elements inside the packaging assembly 102 from moisture, contamination, corrosion, and mechanical shock, such as by applying, injecting or otherwise forming a protective layer to seal the open region.

The mold compound encapsulated packaging assembly 102 is attached to the printed circuit board (PCB) 101 in which are formed one or more conductors 1-6 that extend between opposite (e.g., upper and lower) surfaces of the PCB 101. Though not shown, the packaging assembly 102 may be attached to the PCB 101 using any desired attachment technique, such as by applying a solder joint between each contact structure 125 in the packaging assembly 102 and the corresponding conductor 1-6 in the PCB 101. Though illustrated in simplified form, it will be appreciated that each PCB conductor 1-6 may be formed in the PCB 101 as a conductive pattern of conductive traces, vias and contact pad areas which provide electrical connection between a contact structure 125 on one (upper) side of the PCB 101 and a corresponding power, ground, or signal line (not shown) on the opposite (lower) side of the PCB 101. In selected embodiments, the depicted conductors 1-6 may be implemented cylindrical plated through hole (PTH) structures for providing reference voltages to the integrated circuit 127, where PTH structures 1, 3, 5 are power conductors that provide a power supply voltage and PTH structures 2, 4, 6 are ground conductors that provide a ground supply voltage. As will be appreciated, additional ground and power PTH structures may be formed in the PCB 101 and positioned therein with any desired allocation pattern to provide the required power and ground voltages to the integrated circuit 127. In addition, the PCB conductors 1-6 may be formed in the PCB 101 by drilling openings in the PCB 101, depositing a conductive material (such as metal) to fill the openings, and then forming contact pads on each side of the filled opening, thereby forming conductive PTH structures 1-6. As formed, each PCB conductor 1-6 is formed in alignment with a corresponding contact structure 125 (such as conductive contacts, solder ball, pads, metal lines and via structures) that are formed in the course of fabricating and aligning the packaging assembly 102.

As will be appreciated, power and ground supply noise in the integrated circuit 127 is caused when transistors on the chip are turned ON or OFF. In turn it causes current switching activity in the power/ground conductors 1-6, one or more passive current sensing structures may be formed in the PCB 101 within sensing proximity to the power/ground conductors 1-6 to provide high resolution detection and measurement of the power delivery requirements or behavior in the integrated circuit 127. By using passive current sensing structures to measure the current switching activity in the power/ground conductors 1-6 associated with the turning on and off of the on-chip transistors, circuit designers can design a power delivery network that matches the power delivery requirements of the integrated circuit 127. When formed as an isolated conductive PTH structure adjacent to the power/ground conductors 1-6, the current sensing structures convert dynamic changes in power supply current into a measurable parameter (i.e., voltage) using Faraday's law of induction.

Figure 2:
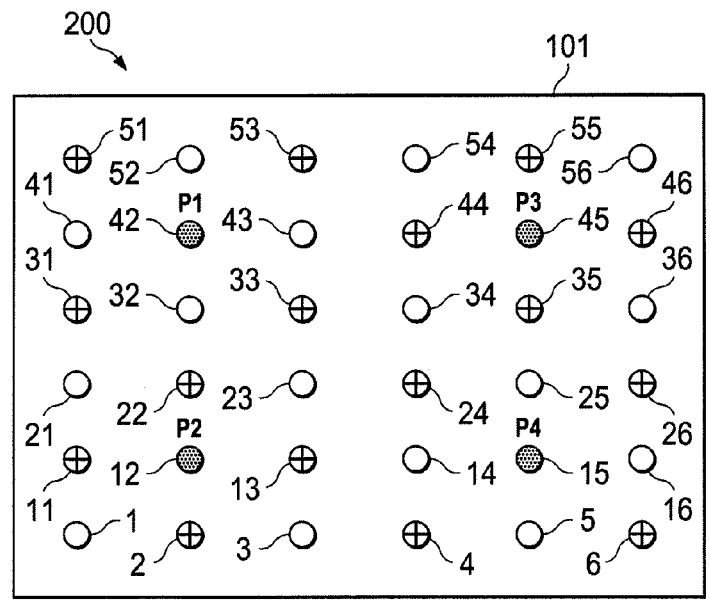
FIG. 2 illustrates a plan view of an example PCB board having an array of four dynamic current probe sensing structures arrayed to detect switching current activity in power and ground conductor paths.
Figure 3:
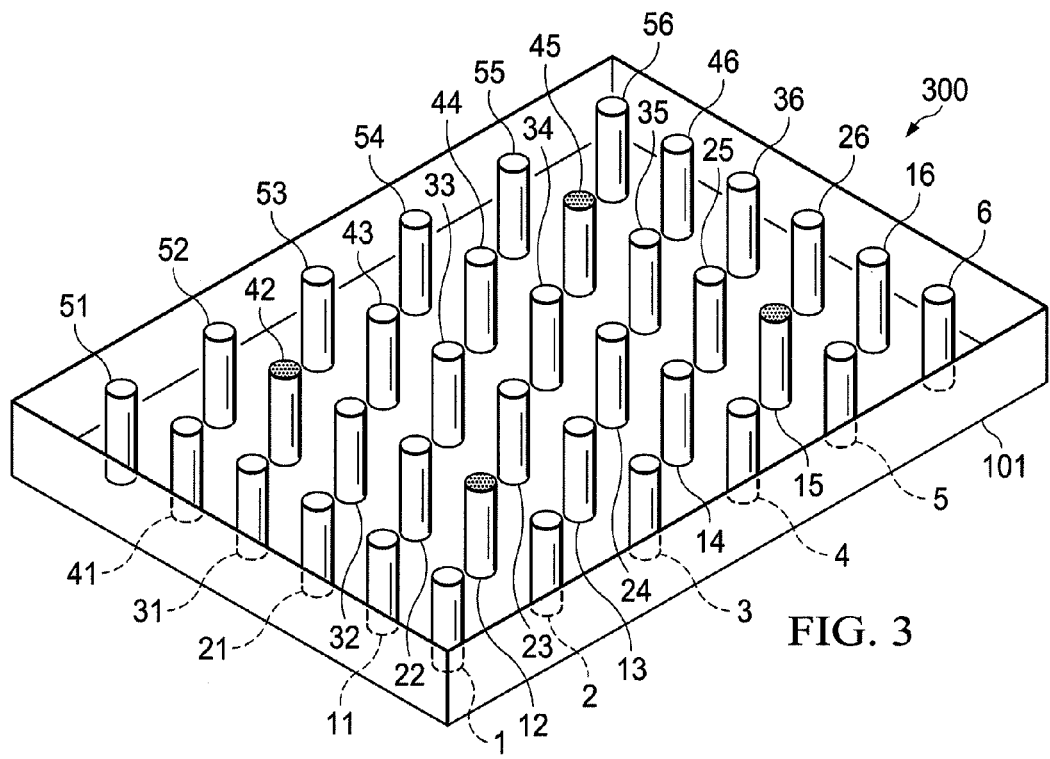
FIG. 3 illustrates in perspective view the example PCB board shown in FIG. 2 with the dynamic current probe sensing structures arrayed to detect switching current activity in power and ground conductor paths.

To illustrate an example implementation for the current sensing structures, reference is now made to FIGS. 2 and 3 which illustrate a plan view 200 and perspective view 300, respectively, of the PCB board 101 which has a plurality of dynamic current probe sensing structures P1 42, P2 12, P3 45, and P4 15 that are arrayed to detect switching current activity in power conductor paths 1, 3, 5, 14, 16, 21, 23, 25, 32, 34, 36, 41, 43, 52, 54, 56 and the ground conductor paths 2, 4, 6, 11, 13, 22, 24, 26, 31, 33, 35, 44, 46, 51, 53, 55. With the current probe sensing PTH structures P1-P4 positioned within the array of power/ground conductor paths in the PCB 101, changes in current through the power delivery network of power and/or ground conductor paths can be sensed as a voltage change through mutual coupling between each probe PTH sensing structure and its neighboring ground and power PTH structures. To represent the detected voltage changes quantitatively, a voltage change or drop Vm across the probe Pm (where m=1, 2, 3, 4) can be calculated as $V_m = \Sigma M_{mj} di_j/dt$, where $M_{mj}$ is the mutual inductance between the mth probe and jth power or ground PTH, and $di_j/dt$ is the current change at the jth power or ground PTH. By properly locating each current probe sensing structure, an imbalance in mutual coupling between power and ground PTHs is achieved so that the net effect produces a significant induced voltage Vm from the desired coupling to either the power or ground PTH structures.

An example of imbalanced mutual coupling is shown in FIG. 2 where each depicted current probe sensing structure effectively detects current changes in the closest power or ground paths. Thus, current probe sensing structure P1 42 is positioned to detect the current change in power paths 41, 52, 43, and 32, while current probe sensing structure P4 15 is positioned to detect the current change in power paths 14, 25, 16, and 5. Similarly, current probe sensing structure P2 12 is positioned to detect the current change in ground return paths 11, 22, 13, and 2, while current probe sensing structure P3 45 is positioned to detect the current change in ground return paths 44, 55, 46, and 35. Of course, not all probe structures P1-P4 need to be used, so that only power probes P1 and P4 are used in some embodiments, or only ground probes P2 and P3 are used in other embodiments.

Though the switching current sensor is described herein with reference to an embodiment using PTH structures in a printed circuit board, it will be appreciated that selected embodiments may also be implemented in other levels of the packaging assembly 102. For example, the sensors may be implemented in a semiconductor layer of a stacked integrated circuit 127 by forming probe sensors from through-silicon-via (TSV) structures that are located adjacent to the power and/or ground via structures to measure and quantify fast switching current (a.k.a., di/dt) events in the stacked integrated circuit. In another example, the sensors may be implemented in the carrier substrate 120 by forming probe sensors with isolated via conductor structures that are located adjacent to the power and/or ground via structures 121 to measure and quantify fast switching current events.

Figure 4:
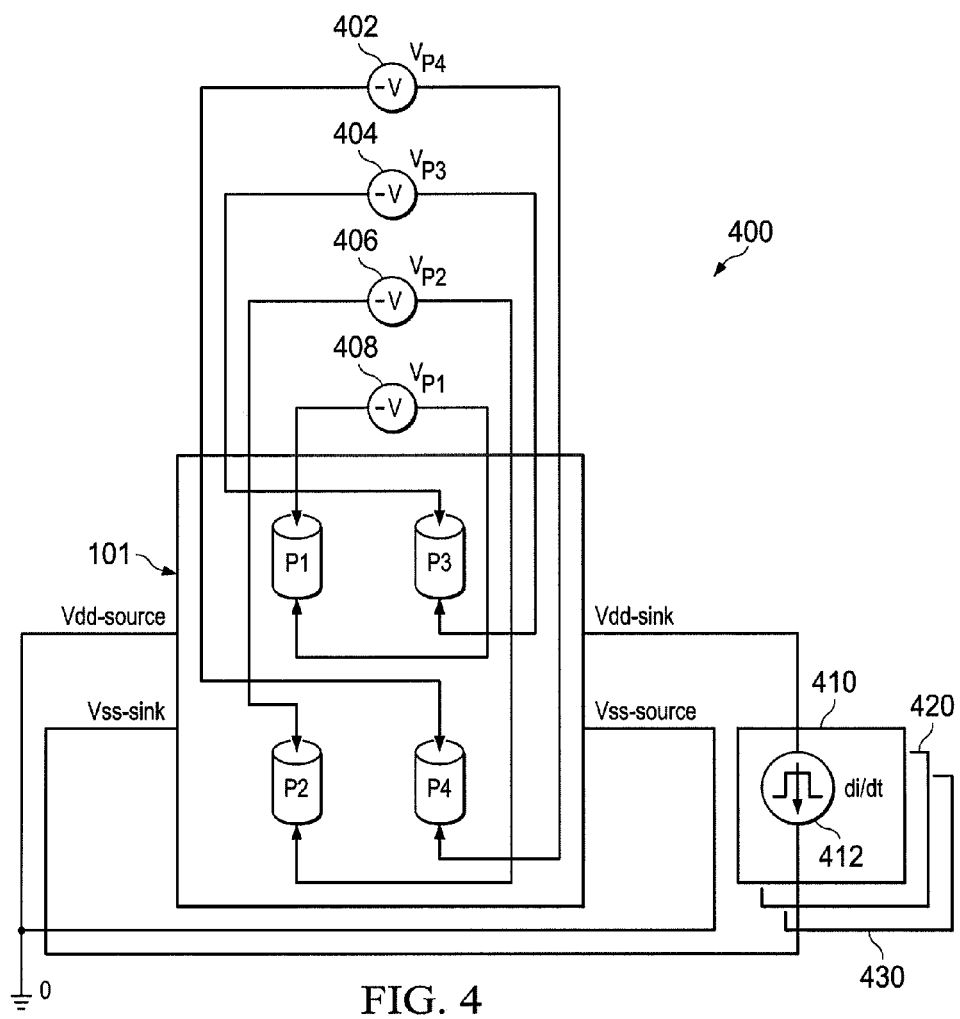
FIG. 4 which illustrates a simplified circuit schematic of a high bandwidth switching current sensor which is connected to take four separate measurements at probes formed with PTH structures that are located adjacent to the power and/or ground via structures.

To illustrate how the individual current probe sensing PTH structures can be used to separately measure dynamic switching currents in different portions of the integrated circuit, reference is now made to the simplified circuit schematic of a high bandwidth switching current sensor 400 shown in FIG. 4. As illustrated, the switching current sensor 400 is connected to take four separate measurements at probes P1, P2, P3, and P4 which are formed with PTH structures that are located adjacent to the power and/or ground via structures in the PCB 101. The voltage measurement across the first current probe sensing PTH structure P1 is detected at voltmeter 408 that is connected across the source and sink of the first current probe sensing PTH structure P1. In similar fashion, the voltage measurement across the second current probe sensing PTH structure P2 is detected at voltmeter 406 that is connected across the source and sink of the second current probe sensing PTH structure P2, and so on with the voltmeters 404 and 402 which are connected to measure the third and fourth current probe sensing PTH structures P3, P4. Although only four probes P1, P2, P3, and P4 are shown, it will be appreciated that the PCB 101 also includes PTH structures for the power and ground conductor paths. In this configuration, the current probe sensing PTH structures P1-P4 detect voltage changes in the power and ground conductor paths of the PCB 101 which are associated with current switching events at the integrated circuit mounted on the PCB 101. These current switching events are schematically represented with the current change circuit 410 which includes a current source 412. If the integrated circuit has different current switching events in different regions of the integrated circuit, these may be separately represented with the current change circuits 420, 430, etc., and then separately monitored by the probes P1-P4. For example, current switching activity in a first region of the integrated circuit (represented by current change circuit 410) may cause voltage changes at the source and sink terminals of the power conductor paths 1, 3, 21, and 23 and ground conductor paths 2, 11, 13, and 22, in which case the second current probe sending PTH structure P2 detects current changes in these power and ground return paths. However, current switching activity in another region of the integrated circuit (represented by current change circuit 420) may cause voltage changes at the source and sink terminals of the power conductor paths 34, 36, 54, 56 and ground conductor paths 35, 44, 46, 55, in which case the third current probe sending PTH structure P3 detects current changes in these power and ground return paths.

Given the electromagnetic mechanisms used to induce voltage changes in the switching current sensor, it will be appreciated that the electrically isolated current probe sensing PTH structure(s) are more sensitive to high frequency switching current events than low frequency switching current events. One way to improve the sensitivity of the current sensor to low frequency switching currents is to add the induced voltages at each current probe sensing PTH structure by connecting a plurality of current probe sensing PTH structures together in sequence, provided that the polarity of the induced voltage on each PTH structure is correctly taken into account. By combining induced voltages, the current sensor can detect lower frequency switching current (di/dt) events.

Figure 5:
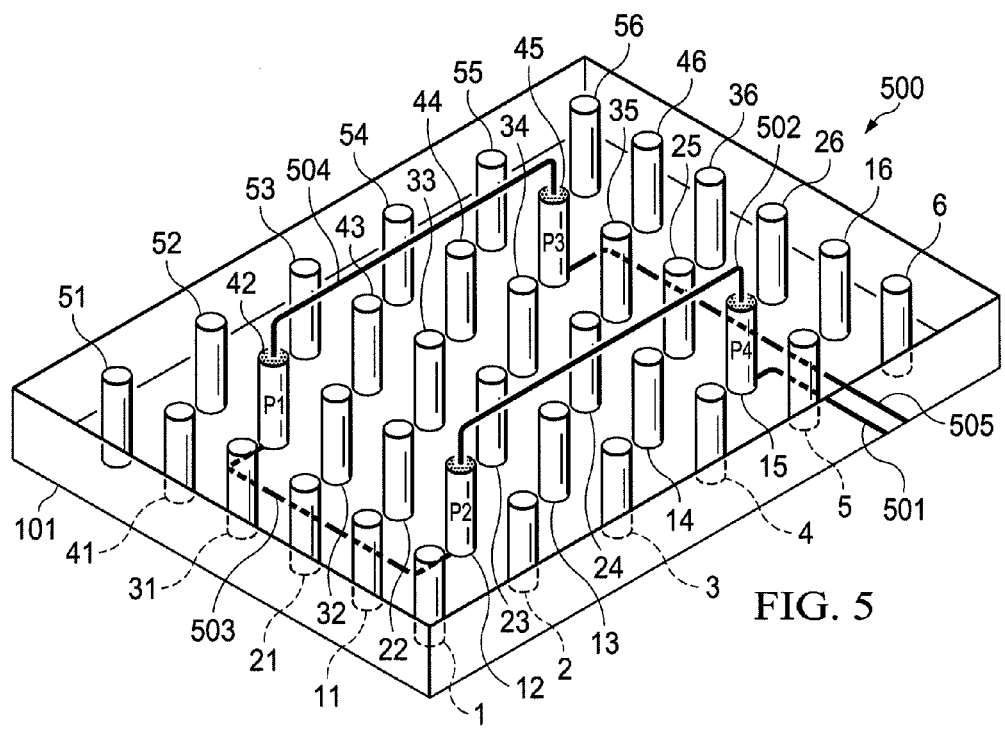
FIG. 5 illustrates in perspective view an example distribution layout of series-connected dynamic current probe sensing structures arrayed to detect switching current activity in power and ground conductor paths.

A current sensor with improved sensitivity is shown in FIG. 5 which illustrates in perspective view 500 an example distribution layout of series-connected dynamic current probe sensing structures P1-P4 arrayed to detect switching current activity in power and ground conductor paths. As illustrated, a first conductive trace 501 is formed on a first (bottom) side of the PCB 101 to connect an external voltage measurement circuit (not shown) to a sink terminal of the current probe sensing structure P4 15, and a second conductive trace 502 is formed on a second (top) side of the PCB 101 to connect a source terminal of the current probe sensing structure P4 15 to the source terminal of the current probe sensing structure P2 12. In turn, a third conductive trace 503 is formed on the first side of the PCB 101 to connect the sink terminal of the current probe sensing structure P2 12 to a sink terminal of the current probe sensing structure P1 42, and a fourth conductive trace 504 is formed on the second side of the PCB 101 to connect the source terminal of the current probe sensing structure P1 42 to the source terminal of the current probe sensing structure P3 45. Lastly, a fifth conductive trace 505 is formed on the second side of the PCB 101 to connect the source terminal of the current probe sensing structure P3 45 to an external voltage measurement circuit. As will be appreciated, the conductive traces connecting the probe sensing structures to the external voltage measurement circuit should be laid out in parallel to improve noise immunity by cross-cancelling signal line noise. In this arrangement, the induced voltages at the current probe sensing PTH structures are added collectively by connecting the PTHs in series. The connection sequence takes into account the polarity of the induced voltage on each PTH, where current probe sensing structures P1 and P4 are positioned as ground path probes and current probe sensing structures P2 and P3 are positioned as power path probes.

As described herein, plated through hole (PTH) probes are used to induce a voltage signal in response to switching current noise (di/dt) that is present in the power/ground PTH structures in the PCB. There are a number of possible applications of this structure. For example, circuit designers can feedback the voltage signal representation of the switching current to a control circuit on the GPU ASIC for purposes of controlling the switching current (di/dt) events. Also, the induced voltage signal can also be used to recover the switching current profile which in turn can be used for power delivery network design.

While the passive switching current sensor described herein is capable of dynamically sensing fast current switching events using conductive plated through hole (PTH) structures in a printed circuit board, it will be appreciated that the current sensor should be calibrated to establish a relationship between the measured or sensed voltage induced at the current probe(s) and a known switching current value for di/dt. In view of the induced voltage equation $Vm=\Sigma M_{mj} di_j/dt$, it can be seen that the induced voltage Vm is linearly proportional to the di/dt value, and not to the change in current value (di) or the transition of the di value. Taking this into account, one calibration approach is to use a switching MOSFET as a load between the power and ground. For example, by connecting a MOSFET and large resistor load (e.g., 5 milli-ohms) in series between the power and ground reference voltages with a series of known di/dt signals applied to the gate of the MOSFET, a well-controlled measurement environment is provided to generate a lookup table matching induced voltages with switching current values di/dt for purposes of calibrating the current sensor. For example, using the switching MOSFET to configure the current sensor may determine that a rising edge of a switching current event at a first di/dt rate (e.g., 15 A/10 ns) induces a voltage increase of approximately 8 mV on the current sensor, while a falling edge of a switching current event at a second di/dt rate (e.g., 76 A/85 ns) induces a voltage decrease of approximately 15 mV on the current sensor.

Another calibration approach is to use a graphics processing unit (GPU) application specific integrated circuit (ASIC) as a load between the power and ground. With the GPU ASIC load configuration, significant current switching (di/dt) events can be triggered and measured by turning ON and OFF a clock tree in the GPU ASIC. The measured current consumption values can used to compare other di/dt events to a clock tree di/dt if the current change values (di) are known. The measured current consumption values can also provide information on the time change (dt) values for the di/dt events in relation to the time change (dt) value for turning on/off clock tree.

Figure 6:
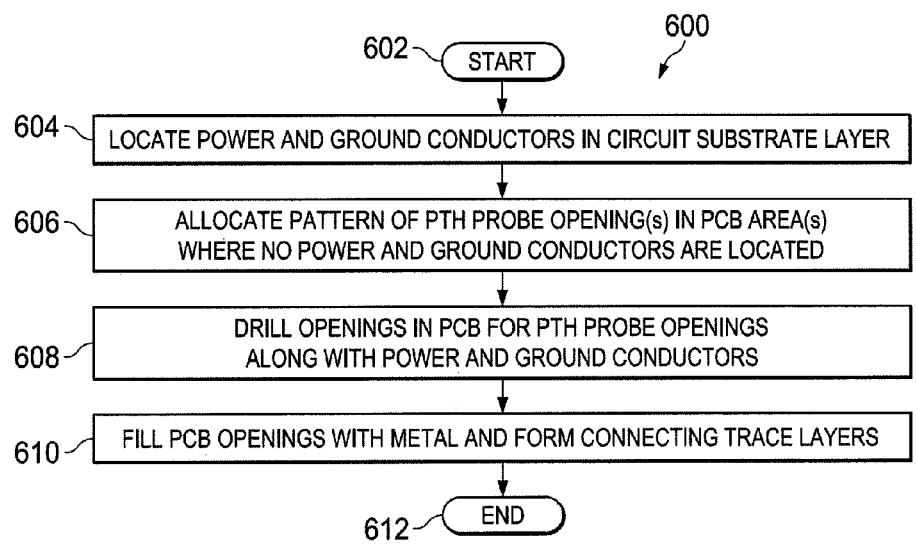
FIG. 6 illustrates a flow diagram for a design and manufacturing sequence for allocating a pattern of plated through hole conductors in a printed circuit board or other packaging substrate in accordance with selected embodiments of the present invention.

FIG. 6 illustrates a flow diagram for a design and manufacturing sequence 600 for allocating a pattern of plated through hole (PTH) probe structures in a printed circuit board (PCB) or other packaging substrate in accordance with selected embodiments of the present invention. The sequence begins at step 602 during an initial design phase. At this point, the locations for the various PTH probe structures have not been defined.

At step 604, the layout patterns for the power and ground PTH structure openings in the PCB are retrieved and located within the PCB area. For example, the PCB locations are retrieved for the PTH structure openings used to form the power conductor paths for providing one or more power supply voltages to the integrated circuit mounted on the PCB. In addition or in the alternatively, the PCB locations are retrieved for the PTH structure openings used to form the ground return conductor paths to the integrated circuit mounted on the PCB. As will be appreciated, once the PCB locations for the power/ground PTH structure openings are located, it is known which portions of the PCB are available for locating PTH probe structure openings.

At step 606, a pattern of one or more PTH probe openings is allocated for any part of the PCB where there are no power/ground PTH structure openings located. As will be appreciated, any allocation pattern may be used, though in selected embodiments, the allocation pattern provides a uniform pattern of allocated PTH probe openings in the PCB area. In accordance with selected embodiments, one or more first PTH probe openings are located within sensing proximity to one or more power PTH structure openings, while one or more second PTH probe openings are located within sensing proximity to one or more ground PTH structure openings, such that the first PTH probe opening(s) are generally located closer to the power PTH structure openings and the second PTH probe openings are generally located closer to the ground PTH structure openings.

After determining that the PTH probe openings have been allocated for the PCB, the sequence proceeds to fabricate the PTH structures in the PCB using the allocated patterns by using the pattern to drill holes on the PCB (step 608). Subsequently, the drilled holes are filled with one or more conductive materials (step 610) to form the conductive PTH structures in the PCB, including isolated PTH probe structures and power/ground PTH structures. At step 612, the sequence ends.

Although the described exemplary embodiments disclosed herein are directed to various passive current sensing structures and methods for making same, the present invention is not necessarily limited to the example embodiments which illustrate inventive aspects of the present invention that are applicable to a wide variety of fabrication processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the PTH probe structures may be defined with different shapes, relative dimensions and patterning layout arrangements than shown. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

Accordingly, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

What is claimed is:

1. An electronic apparatus for sensing switching current noise in a power delivery network for an integrated circuit die comprising:
    an integrated circuit die comprising a plurality of conductive power and/or ground connection leads forming a power delivery network for the integrated circuit die, and
    a circuit substrate having the integrated circuit die disposed thereupon, the circuit substrate comprising:
        a plurality of conductive power and/or ground connection structures formed in the circuit substrate to be electrically connected, respectively, to the plurality of conductive power and/or ground connection leads; and
        one or more electrically isolated current sensing structures formed in the circuit substrate within sensing proximity to the plurality of conductive power and/or ground connection structures to sense current switching activity in the plurality of conductive power and/or ground connection structures by inductively converting dynamic current changes in the plurality of conductive power and/or ground connection structures into a measurable voltage signal.

2. The electronic apparatus of claim 1, where the integrated circuit die comprises a graphics processing unit.

3. The electronic apparatus of claim 1, where the circuit substrate comprises a printed circuit board having the integrated circuit die disposed thereon.

4. The electronic apparatus of claim 1, where the circuit substrate comprises a printed circuit board comprising:
    a first plurality of conductive plated through hole structures formed in the printed circuit board to electrically connect one or more external power supply reference voltages to a plurality of conductive power connection leads on the integrated circuit die;
    a second plurality of conductive plated through hole structures formed in the printed circuit board to electrically connect one or more external ground supply reference voltages to a plurality of conductive ground connection leads on the integrated circuit die;
    one or more first isolated conductive plated through hole structures formed in the printed circuit board within sensing proximity to the first plurality of conductive plated through hole structures for sensing current switching activity in the first plurality of conductive plated through hole structures; and
    one or more second isolated conductive plated through hole structures formed in the printed circuit board within sensing proximity to the second plurality of conductive plated through hole structures for sensing current switching activity in the second plurality of conductive plated through hole structures.

5. The electronic apparatus of claim 1, where each of the one or more isolated current sensing structures are positioned in the circuit substrate to induce a voltage change from any switching current in at least one of the plurality of conductive power and/or ground connection structures.

6. The electronic apparatus of claim 1, where the one or more isolated current sensing structures comprise:
    a first isolated plated through hole power probe formed in the circuit substrate and positioned within sensing proximity to a plurality of conductive power connection structures and a plurality of conductive ground connection structures so as to produce greater mutual coupling to the plurality of conductive power connection structures than the plurality of conductive ground connection structures.

7. The electronic apparatus of claim 1, where the one or more isolated current sensing structures comprise:
    a first isolated plated through hole ground probe formed in the circuit substrate and positioned within sensing proximity to a plurality of conductive power connection structures and a plurality of conductive ground connection structures so as to produce greater mutual coupling to the plurality of conductive ground connection structures than the plurality of conductive power connection structures.

8. The electronic apparatus of claim 1, where the one or more isolated current sensing structures comprise a plurality of isolated plated through hole current probes formed in the circuit substrate and connected in series to combine each voltage signal induced at each of the plurality of isolated plated through hole current probes into a single combined voltage signal representation of the switching current noise in the power delivery network for the integrated circuit die.

9. The electronic apparatus of claim 1 wherein the plurality of conductive power structures receive a first operating voltage and/or the plurality of conductive ground connection structures receive a second operating voltage so as to provide power and/or ground reference voltages to the integrated circuit die.

10. A method for sensing switching current noise in a power delivery network for an integrated circuit die comprising:
proving a circuit substrate that is affixed to an integrated circuit die such that a plurality of conductive power and/or ground connection leads from the integrated circuit die are electrically connected, respectively, to a plurality of conductive power and/or ground connection structures formed in the circuit substrate, where the circuit substrate further comprises one or more passive current sensing structures formed within sensing proximity to the plurality of conductive power and/or ground connection structures;
supplying reference voltages and input stimuli through the plurality of conductive power and/or ground connection structures formed in the circuit substrate to activate the integrated circuit die; and
sensing current switching activity in the plurality of conductive power and/or ground connection structures by using the one or more passive current sensing structures to inductively convert dynamic current changes in the plurality of conductive power and/or ground connection structures into one or more measurable voltage signals.

11. The method of claim 10, where providing the circuit substrate that is affixed to the integrated circuit die comprises affixing a graphics processing unit to a printed circuit board.

12. The method of claim 10, where providing the circuit substrate comprises providing a printed circuit board comprising:
a first plurality of conductive plated through hole structures formed in the printed circuit board to electrically connect one or more external power supply reference voltages to a plurality of conductive power connection leads on the integrated circuit die;
a second plurality of conductive plated through hole structures formed in the printed circuit board to electrically connect one or more external ground supply reference voltages to a plurality of conductive ground connection leads on the integrated circuit die;
one or more first isolated conductive plated through hole structures formed in the printed circuit board as passive current sensing structures within sensing proximity to the first plurality of conductive plated through hole structures for sensing current switching activity in the first plurality of conductive plated through hole structures; and
one or more second isolated conductive plated through hole structures formed in the printed circuit board as passive current sensing structures within sensing proximity to the second plurality of conductive plated through hole structures for sensing current switching activity in the second plurality of conductive plated through hole structures.

13. The method of claim 10, where sensing current switching activity comprises inducing on the one or more passive current sensing structures a voltage change from any switching current in at least one of the plurality of conductive power and/or ground connection structures when the integrated circuit die is activated by the reference voltages and input stimuli.

14. The method of claim 10, where providing the circuit substrate comprises providing a circuit substrate in which a first passive current sensing structure is formed in the circuit substrate as an isolated plated through hole power probe that is positioned within sensing proximity to a plurality of conductive power connection structures and a plurality of conductive ground connection structures so as to produce greater mutual coupling to the plurality of conductive power connection structures than the plurality of conductive ground connection structures.

15. The method of claim 10, where providing the circuit substrate comprises providing a circuit substrate in which a first passive current sensing structure is formed in the circuit substrate as an isolated plated through hole ground probe that is positioned within sensing proximity to a plurality of conductive power connection structures and a plurality of conductive ground connection structures so as to produce greater mutual coupling to the plurality of conductive ground connection structures than the plurality of conductive power connection structures.

16. The method of claim 10, where providing the circuit substrate comprises providing a circuit substrate in which a first passive current sensing structure is formed in the circuit substrate from a plurality of isolated plated through hole current probes that are connected in series to combine each voltage signal induced at each of the plurality of isolated plated through hole current probes into a single combined voltage signal representation of the switching current noise in the power delivery network for the integrated circuit die.

17. The method of claim 10 where sensing current switching activity comprises calculating a voltage change $V=\Sigma M_j di_j/dt$ across a first passive current sensing structure, where $M_j$ is a measure of mutual inductance between the first passive current sensing structure and a jth conductive power and/or ground connection structure, and $di_j/dt$ is the current change at the jth conductive power and/or ground connection structure.

18. The method of claim 10 further comprising generating the one or more measurable voltage signals as an input to a switching current detector formed on the integrated circuit die.

19. A sensor for sensing switching current noise in a power delivery network for an integrated circuit die, the sensor comprising a plurality of current probe sensing conductors arrayed in relation to a plurality of power delivery conductors in the power delivery network to sense current switching activity in the plurality of power delivery conductors by inductively converting dynamic current changes in the plurality of power delivery conductors into one or more measurable voltage signals.

20. The sensor of claim 19, where the plurality of current probe sensing conductors are formed in a printed circuit board as a plurality of current probe sensing plated through hole structures and positioned in an array of a plurality of conductive plated through hole structures in the power delivery network and connected in series to combine each voltage signal induced at each of the plurality of current probe sensing plated through hole structures into a single combined voltage signal representation of the switching current noise (di/dt) in the power delivery network for the integrated circuit die.

21. The sensor of claim 19, where the plurality of current probe sensing conductors are formed in a semiconductor substrate as a plurality of current probe sensing through-silicon-via structures and positioned in an array of a plurality of conductive through-silicon-via structures in the power delivery network and connected in series to combine each voltage signal induced at each of the plurality of current probe sensing through-silicon-via structures into a single combined voltage signal representation of the switching current noise (di/dt) in the power delivery network for the integrated circuit die.

* * * * *